US012563942B2

(12) United States Patent
Jin et al.

(10) Patent No.: US 12,563,942 B2
(45) Date of Patent: Feb. 24, 2026

(54) DISPLAY PANEL AND MANUFACTURING METHOD THEREFOR, AND DISPLAY APPARATUS

(71) Applicant: BOE Technology Group Co., Ltd., Beijing (CN)

(72) Inventors: Qian Jin, Beijing (CN); Wei Huang, Beijing (CN); Qian Sun, Beijing (CN); Tianhao Lu, Beijing (CN); Yang Li, Beijing (CN); Liangliang Kang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 222 days.

(21) Appl. No.: 18/271,851

(22) PCT Filed: Jul. 1, 2022

(86) PCT No.: PCT/CN2022/103314
§ 371 (c)(1),
(2) Date: Jul. 12, 2023

(87) PCT Pub. No.: WO2023/000953
PCT Pub. Date: Jan. 26, 2023

(65) Prior Publication Data
US 2024/0090299 A1 Mar. 14, 2024

(30) Foreign Application Priority Data
Jul. 21, 2021 (CN) .......................... 202110828262.7

(51) Int. Cl.
*H10K 59/38* (2023.01)
*H10K 59/12* (2023.01)
(Continued)

(52) U.S. Cl.
CPC ......... *H10K 59/38* (2023.02); *H10K 59/1201* (2023.02); *H10K 59/351* (2023.02); *H10K 59/876* (2023.02)

(58) Field of Classification Search
CPC ............................ H10K 59/38; H10K 59/876
(Continued)

(56) References Cited

U.S. PATENT DOCUMENTS

2020/0373360 A1 11/2020 Hack et al.
2021/0225942 A1 7/2021 Suzuki et al.
(Continued)

FOREIGN PATENT DOCUMENTS

CN 106410049 A 2/2017
CN 108878504 A 11/2018
(Continued)

OTHER PUBLICATIONS

International Search Report for PCT/CN2022/103314 Mailed Aug. 30, 2022.

*Primary Examiner* — Christopher M Raabe
(74) *Attorney, Agent, or Firm* — Ling Wu; Stephen Yang; Ling and Yang Intellectual Property

(57) ABSTRACT

A display panel includes: multiple light-emitting devices arranged on a substrate, each light-emitting device includes a first electrode, multiple light-emitting units and a second electrode sequentially arranged in a direction away from the substrate, a microcavity structure is formed between the first electrode and the second electrode, the light-emitting unit includes a light-emitting layer, light-emission colors of at least two light-emitting layers in the same light-emitting device are different, and at least one light-emitting device includes a cavity length adjusting layer; and a color conversion layer including multiple wavelength conversion units, each wavelength conversion unit corresponds to a
(Continued)

light-emitting device having the cavity length adjusting layer, the wavelength conversion unit is arranged on a light outlet side of the light-emitting device, at least one light-emission peak in a light-emission band of the light-emitting device is less than or equal to an intrinsic light-emission peak of a corresponding wavelength conversion unit.

20 Claims, 9 Drawing Sheets

(51) Int. Cl.
    *H10K 59/35*       (2023.01)
    *H10K 59/80*       (2023.01)
(58) Field of Classification Search
    USPC ................................................. 313/498–512
    See application file for complete search history.

(56)            References Cited

U.S. PATENT DOCUMENTS

| | | | |
|---|---|---|---|
| 2021/0234112 A1 | 7/2021 | Seo et al. | |
| 2022/0267668 A1* | 8/2022 | Ishisone ................. | C09K 11/06 |
| 2024/0284748 A1* | 8/2024 | Zeng .................... | H10K 59/873 |
| 2024/0324386 A1* | 9/2024 | Watabe .................... | G02B 5/30 |
| 2024/0423025 A1* | 12/2024 | Hodo .................... | H10K 59/10 |
| 2025/0126993 A1* | 4/2025 | Sasagawa ................. | G09F 9/00 |
| 2025/0185487 A1* | 6/2025 | Shim .................... | H10K 59/124 |

FOREIGN PATENT DOCUMENTS

| | | |
|---|---|---|
| CN | 110911459 A | 3/2020 |
| CN | 111987234 A | 11/2020 |
| CN | 112219452 A | 1/2021 |
| CN | 112236809 A | 1/2021 |

* cited by examiner

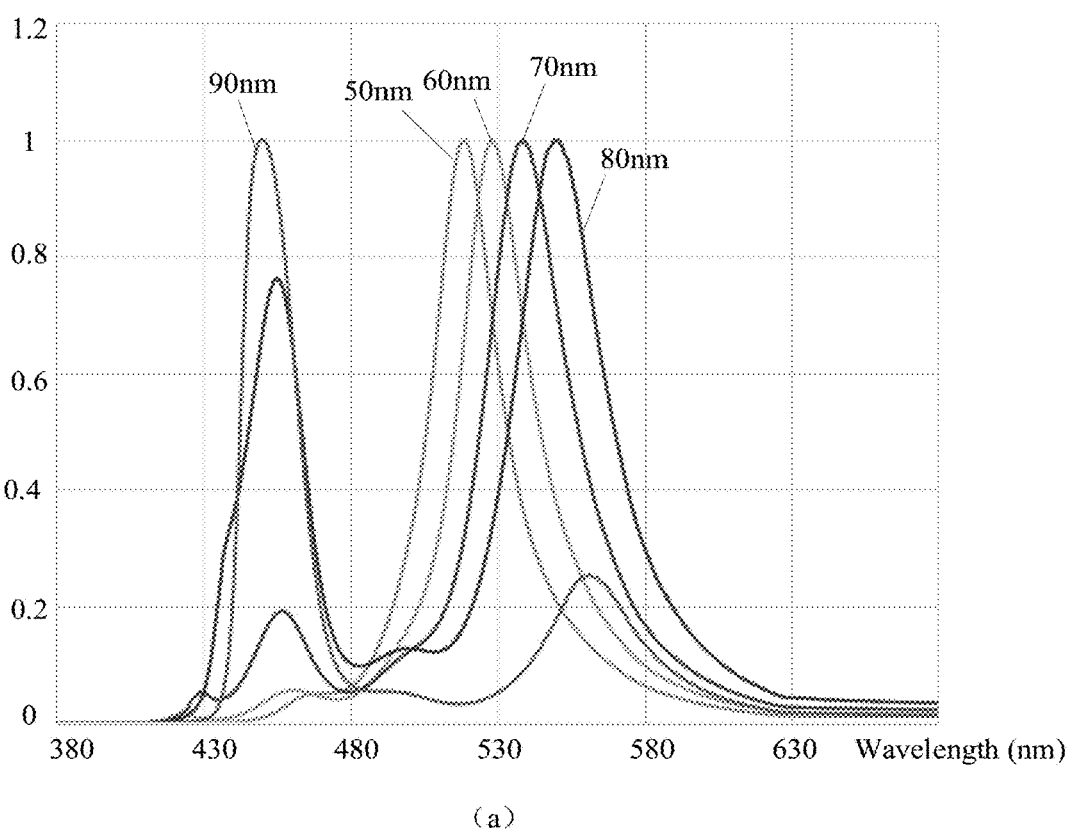
(a)
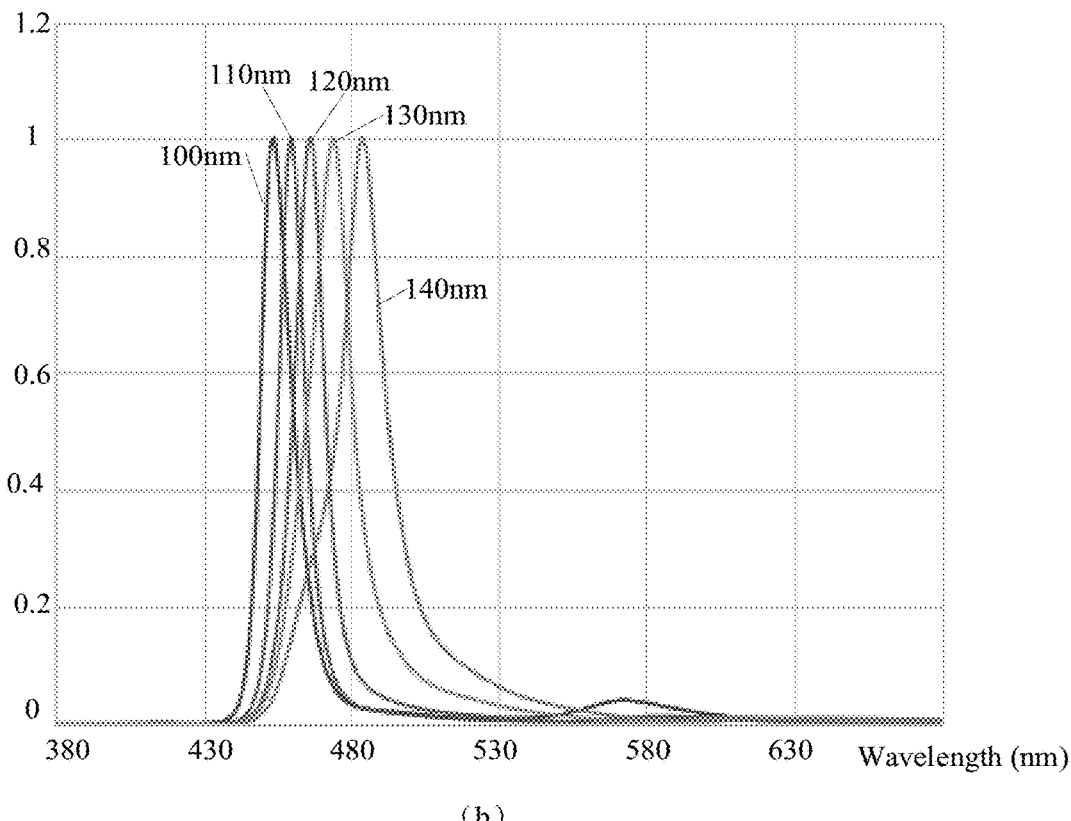
(b)
FIG. 5

Brightness (cd/m²)

Thickness (nm)

Wavelength (nm)

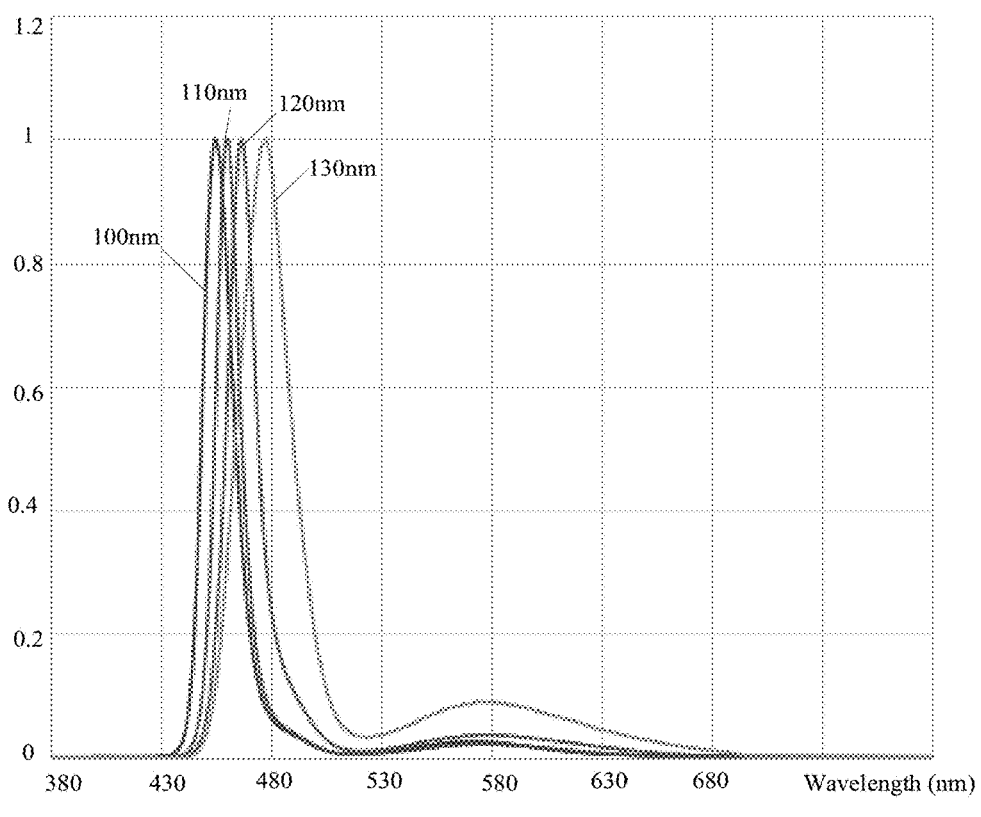
(a)
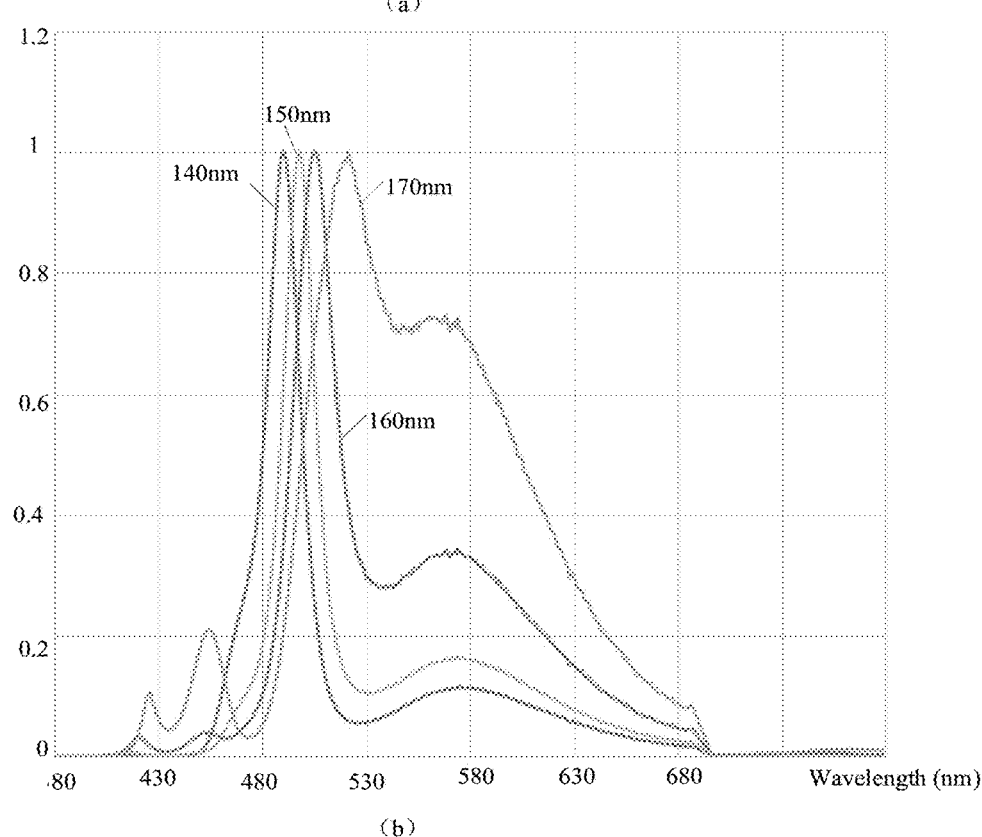
(b)
FIG. 9

Form multiple light-emitting devices on a substrate, each of the light-emitting devices includes a first electrode, multiple light-emitting units and a second electrode arranged sequentially in a direction away from the substrate; at least one of the light-emitting devices further includes a cavity length adjusting layer ⟋ S10

Form a color conversion layer, the color conversion layer includes multiple wavelength conversion units, each of which corresponds to one light-emitting device having the cavity length adjusting layer, and the wavelength conversion unit is arranged on a light outlet side of the light-emitting device ⟋ S20

FIG. 12

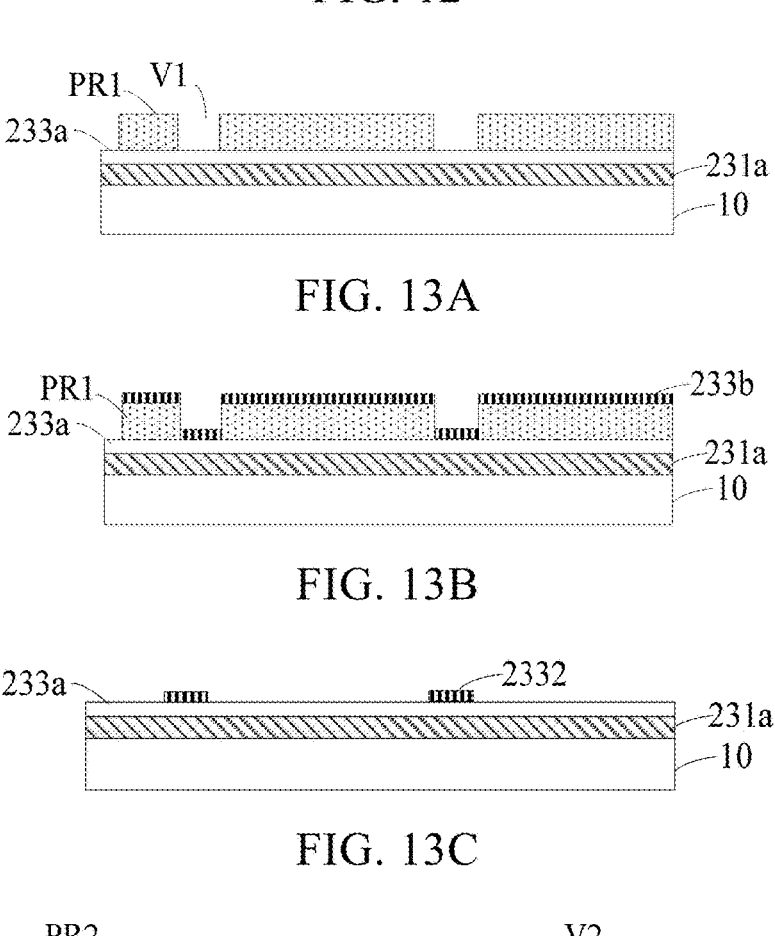

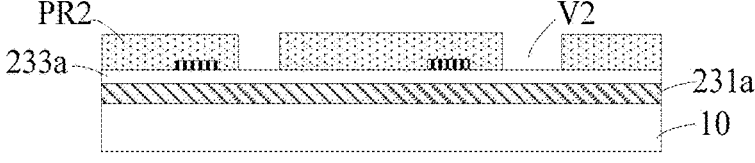

FIG. 13D

DISPLAY PANEL AND MANUFACTURING METHOD THEREFOR, AND DISPLAY APPARATUS

CROSS-REFERENCE TO RELATED APPLICATIONS

The present application is a U.S. National Phase Entry of International Application PCT/CN2022/103314 having an international filing date of Jul. 1, 2022, which claims priority of Chinese patent application No. 202110828262.7, entitled "Display Panel and Manufacturing Method Therefor, and Display Apparatus", filed to the CNIPA on Jul. 21, 2021, the contents of the above-identified applications should be interpreted as being incorporated into the present application by reference.

TECHNICAL FIELD

The present disclosure relates to the field of display technology, and particularly relates to a display panel and a method for manufacturing the display substrate, and a display apparatus.

BACKGROUND

A display architecture in which quantum dot layer is combined with OLED (Organic Light-Emitting Diode) can achieve higher color gamut, higher resolution and larger viewing angle, which is suitable for large-size self-luminous display technology.

SUMMARY

The present disclosure provides a display panel and a manufacturing method thereof, and a display apparatus.

In a first aspect, the present disclosure provides a display panel including:

a plurality of light-emitting devices arranged on a substrate, each of the light-emitting devices includes a first electrode, a plurality of light-emitting units, and a second electrode sequentially arranged in a direction away from the substrate; wherein the first electrode is a reflection electrode, the second electrode is a transflective electrode, and a microcavity structure is formed between the first electrode and the second electrode; the light-emitting units each include a light-emitting layer, light-emission colors of at least two light-emitting layers in a same light-emitting device are different; at least one of the light-emitting devices further includes a cavity length adjusting layer positioned between the first electrode and a light-emitting unit immediately adjacent to the first electrode;

a color conversion layer, which includes a plurality of wavelength conversion units, wherein each of the wavelength conversion units corresponds to one light-emitting device having the cavity length adjusting layer, and the wavelength conversion unit is arranged on a light exit side of the light-emitting device, and is configured to convert light which is irradiated to the wavelength conversion unit and is in a light absorption band of the wavelength conversion unit into light of a target color and emit the light of the target color;

wherein at least one light-emission peak in a light-emission band of the light-emitting device is less than or equal to an intrinsic light-emission peak of a corresponding wavelength conversion unit, and the light absorption band of the wavelength conversion unit is overlapped with the light-emission band of the light-emitting device.

In some embodiments, a portion of the light absorption band of the wavelength conversion unit overlapped with the light-emission band of the light-emitting device accounts for 50% to 100% of the light-emission band.

In some embodiments, the plurality of wavelength conversion units of the color conversion layer are divided into multiple types, target colors corresponding to different types of wavelength conversion units are different, and light-emission bands of light-emitting devices corresponding to different types of wavelength conversion units are different.

In some embodiments, the multiple types of wavelength conversion units includes a red wavelength conversion unit and a green wavelength conversion unit, wherein a target color corresponding to the red wavelength conversion unit is red, and a target color corresponding to the green wavelength conversion unit is green.

A light-emission band of a light-emitting device corresponding to the red wavelength conversion unit includes [380 nm, 480 nm]; a light-emission band of a light-emitting device corresponding to the green wavelength conversion unit includes [380 nm, 580 nm].

The color conversion layer further includes a plurality of scattering units, each of which corresponds to one light-emitting device, and a light-emission band of the light-emitting devices corresponding to the scattering units includes [380 nm, 480 nm].

In some embodiments, thicknesses of the cavity length adjusting layers corresponding to different types of wavelength conversion units are different.

In some embodiments, a plurality of light-emitting layers in each light-emitting device includes: two blue light-emitting layers and a green light-emitting layer positioned between the two blue light-emitting layers.

A thickness a the cavity length adjusting layer in the light-emitting device corresponding to the red wavelength conversion unit is in a range of [100 nm, 120 nm], so that a light-emission band of the light-emitting device corresponding to the red wavelength conversion unit includes [380 nm, 480 nm].

A thickness of a cavity length adjusting layer in the light-emitting device corresponding to the green wavelength conversion unit is in a range of [70 nm, 90 nm], so that a light-emission band of the light-emitting device corresponding to the green wavelength conversion unit includes [380 nm, 580 nm].

In some embodiments, a plurality of light-emitting layers in each light-emitting device includes: a blue light-emitting layer and a yellow light-emitting layer.

A thickness of a cavity length adjusting layer in the light-emitting device corresponding to the red wavelength conversion unit is in a range of [150 nm, 170 nm], so that a light-emission band of the light-emitting device corresponding to the red wavelength conversion unit includes [380 nm, 480 nm] and [580 nm, 680 nm].

A thickness of a cavity length adjusting layer in the light-emitting device corresponding to the green wavelength conversion unit is in a range of [130 nm, 150 nm), so that a light-emission band of the light-emitting device corresponding to the green wavelength conversion unit includes [380 nm, 580 nm].

In some embodiments, a material of the wavelength conversion units includes a quantum dot material.

In some embodiments, the first electrode includes a first transparent conductive layer and a metal reflective layer located on a side of the first transparent conductive layer away from the substrate.

In some embodiments, the cavity length adjusting layer is made of a transparent conductive material.

Alternatively, the cavity length adjusting layer is made of a transparent insulation material, and a second transparent conductive layer is further provided on a side of the cavity length adjusting layer away from the substrate, an orthographic projection of the second transparent conductive layer on the substrate extends beyond an orthographic projection of the cavity length adjusting layer on the substrate, and a part of the second transparent conductive layer that extends beyond the cavity length adjusting layer is electrically connected with the first electrode.

In some embodiments, the display panel further includes: a color film layer arranged on a side of the color conversion layer away from the substrate, the color film layer includes a plurality of color filter portions, each of the scattering units and each of the wavelength conversion units correspond to one of the color filter portions, and a color of the color filter portion is the same as a color of light emitted from its corresponding scattering portion or wavelength conversion unit.

In some embodiments, each light-emitting device includes N light-emitting units arranged sequentially in the direction away from the substrate, wherein light-emitting layers of i-th light-emitting units of the plurality of light-emitting devices is of an integral structure; N and i are both integers, $N>1$, $0<i<N$.

In some embodiments, a charge generation layer is provided between every two adjacent light-emitting units in a same light-emitting device.

In some embodiments, the display panel further includes: a first encapsulation layer and a second encapsulation layer.

The first encapsulation layer is arranged at a side of the plurality of light-emitting devices away from the substrate, and is configured to encapsulate the plurality of light-emitting devices.

The color conversion layer is arranged on a side of the first encapsulation layer away from the substrate.

The second encapsulation layer is arranged on a side of the color conversion layer away from the substrate, and is configured to encapsulate the color conversion layer.

In some embodiments, the display panel further includes a cover plate, a first encapsulation layer, a second encapsulation layer and a filling layer.

The first encapsulation layer is arranged at a side of the plurality of light-emitting devices away from the substrate, and is configured to encapsulate the plurality of light-emitting devices, The cover plate is arranged opposite to the substrate.

The color conversion layer is arranged on a side of the cover plate facing the substrate, and the second encapsulation layer is arranged on a side of the color conversion layer away from the cover plate, and is configured to encapsulate the color conversion layer.

The filling layer is arranged between the first encapsulation layer and the second encapsulation layer.

In a second aspect, an embodiment of the present disclosure further provides a method for manufacturing a display panel, including:

forming a plurality of light-emitting devices on a substrate, each of the light-emitting devices includes a first electrode, a plurality of light-emitting units, and a second electrode sequentially arranged in the direction away from the substrate; wherein the first electrode is a reflection electrode, the second electrode is a transflective electrode, and a microcavity structure is formed between the first electrode and the second electrode; the light-emitting units each include a light-emitting layer, light-emission colors of at least two light-emitting layers in a same light-emitting device are different; at least one of the light-emitting devices further includes a cavity length adjusting layer positioned between the first electrode and a light-emitting unit immediately adjacent to the first electrode.

Forming a color conversion layer, the color conversion layer includes a plurality of wavelength conversion units, each of the wavelength conversion units corresponds to one light-emitting device having the cavity length adjusting layer, and the wavelength conversion unit is arranged on a light exit side of the light-emitting device, and is configured to convert light which is irradiated to the wavelength conversion unit and in a light absorption band of the wavelength conversion unit into light of a target color and emit the light of the target color.

At least one light-emission peak in a light-emission band of the light-emitting device is less than or equal to an intrinsic light-emission peak of a corresponding wavelength conversion unit, and a light absorption band of the wavelength conversion unit is overlapped with the light-emission band of the light-emitting device.

In a third aspect, an embodiment of the present disclosure further provides a display apparatus including the display panel described above.

BRIEF DESCRIPTION OF DRAWINGS

Accompanying drawings are provided to provide a further understanding of the disclosure and constitute a part of the specification and together with the following detailed description serve to explain the disclosure but does not constitute limitations on the present disclosure. In the drawings:

FIG. 5 is a peak position diagram of a light emitting device when it includes two blue light-emitting layers and one green light-emitting layer.

FIG. 9 is a peak position diagram of a light emitting device when it includes one blue light-emitting layer and one yellow light-emitting layer.

FIG. 12 is a flowchart of a method for manufacturing a display panel according to some embodiments of the present disclosure.

FIGS. 13A to 13H are schematic diagrams of the process of step S10 in the method for manufacturing the display panel according to some embodiments of the present disclosure.

DETAILED DESCRIPTION

Figure 1:
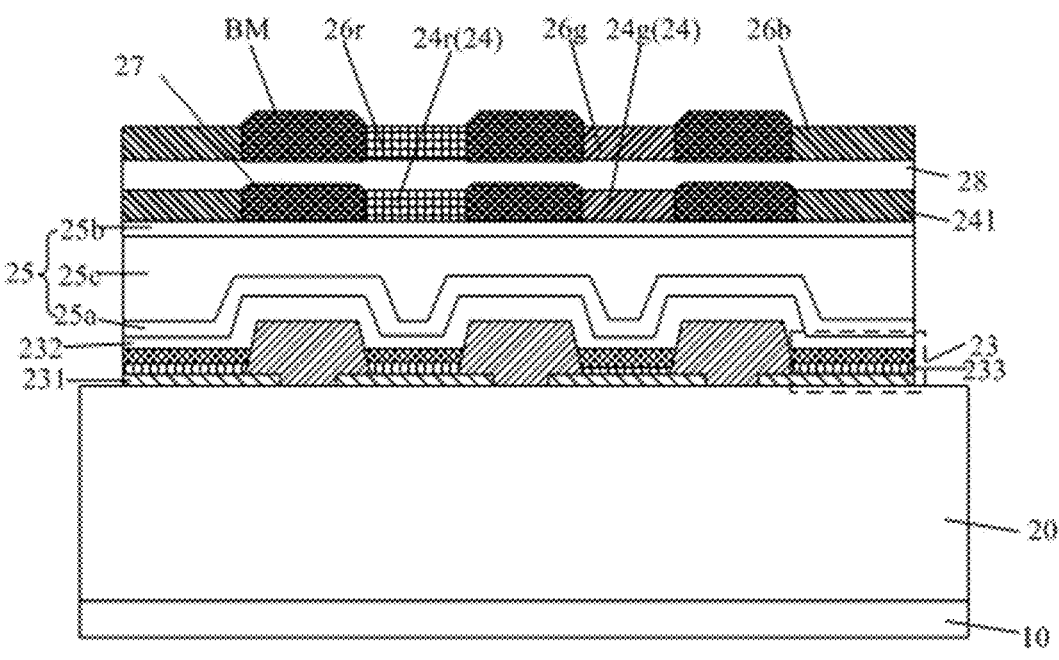
FIG. 1 is a schematic diagram of a display panel according to some embodiments of the present disclosure.

Specific embodiments of the present disclosure are described in detail below with reference to the accompanying drawings. It should be understood that the specific embodiments described herein are intended only to illustrate and explain the disclosure and are not intended to limit it.

In order to make objectives, technical solutions and advantages of the embodiments of the present disclosure more clear, the technical solutions of the embodiments of the present disclosure will be clearly and completely described below with reference to the drawings of the embodiments of the present disclosure. Apparently, the described embodiments are a part of the embodiments of the present disclosure, not all of the embodiments. Based on the described embodiments of the present disclosure, all other embodiments obtained by those of ordinary skill in the art without inventive effort are within the protection scope of the present disclosure.

Terms used herein for describing embodiments of the present disclosure are not intended to limit and/or define the scope of the present disclosure. For example, unless otherwise defined, technical terms or scientific terms used in the present disclosure should have common meanings understood by those ordinarily skilled in the art to which the present disclosure pertains. It should be understood that the wordings "first," "second," and the like used in the present disclosure do not denote any order, quantity, or importance, but are merely used to distinguish between different components. Unless the context clearly dictates otherwise, similar wordings such as "a", "an" or "the" in the singular form do not indicate a quantitative limitation, but indicate existence of at least one. Wordings such as "including" or "containing", or the like mean that elements or articles appearing before "including" or "containing" cover elements or articles and their equivalents listed and appearing after "including" or "containing", and do not exclude other elements or articles. "Connect", "join", or a similar term is not limited to a physical or mechanical connection, but may include an electrical connection, whether direct or indirect. Terms such as "up", "down", "left" or "right" are only used to indicate relative positional relationship, and when an absolute position of a described object is changed, the relative positional relationship may also be changed correspondingly.

In the following description, when an element or a layer is referred to as being "on" or "connected to" another element or layer, the element or layer may be directly on or directly connected to the other element or layer, or an intermediate element or layer may be present. However, when an element or layer is referred to as being "directly on" or "directly connected" to another element or layer, there is no intermediate element or layer. The term "and/or" includes any and all combinations of one or more related listed items.

The display architecture in which a quantum dot layer is combined with OLED device can achieve higher color gamut, higher resolution and larger viewing angle. In some examples, the display panel includes a quantum dot layer and multiple blue OLED devices, the quantum dot layer includes red quantum dot units, green quantum dot units and scattering units. Each of the red quantum dot units, each of the green quantum dot units and each of the scattering units correspond to one blue OLED device. The red quantum dot units emit red light under excitation of blue light, the green quantum dot units emit green light under excitation of blue light, and the scattering units scatter blue light. However, due to a low light conversion efficiency of quantum dot units, an overall brightness of the display panel is not high. In order to improve the overall brightness of the display panel, in some other examples, the blue OLED devices are replaced with BG devices, BGB devices, and BY devices. Among them, the BG device refers to an OLED device with a light emitting layer that includes a blue light-emitting layer and a green light-emitting layer. The BGB device refers to an OLED device with a light emitting layer that includes two blue light-emitting layers and one green light-emitting layer therebetween. The BY device refers to an OLED device with a light emitting layer that includes a blue light-emitting layer and a yellow light-emitting layer. However, such configuration will reduce the light utilization of the light-emitting device and lead to an increase in power consumption.

FIG. 1 is a schematic diagram of a display panel according to some embodiments of the present disclosure. As shown in FIG. 1, the display panel includes a substrate 10, multiple light-emitting devices 23 arranged on the substrate 10 and a color conversion layer.

The substrate 10 may be a glass substrate and may be a flexible substrate made of a flexible material such as polyimide (PI), thereby facilitating implementing flexible display.

Figure 2:
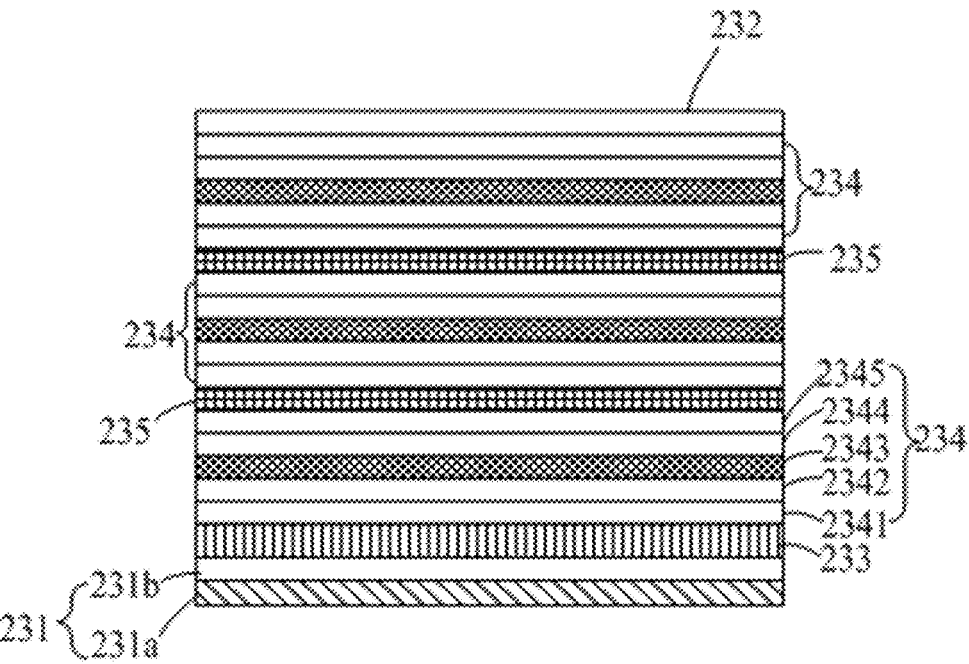
FIG. 2 is a schematic diagram of a light-emitting device according to some embodiments of the present disclosure.
Figure 3:
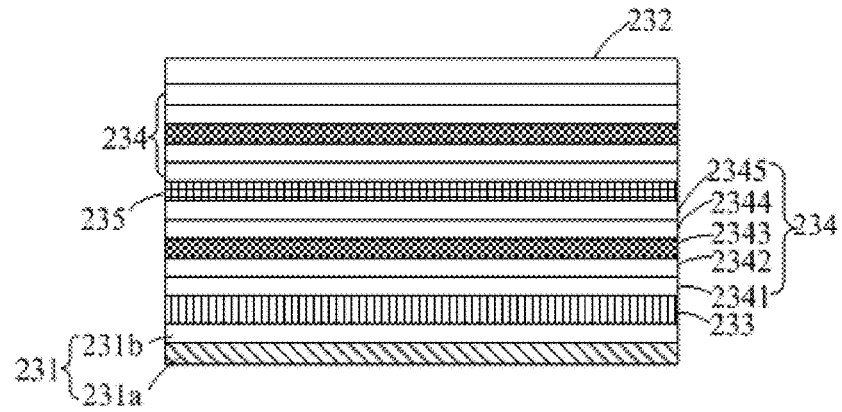
FIG. 3 is a schematic diagram of a light-emitting device according to some other embodiments of the present disclosure.

The light-emitting devices 23 are arranged on the substrate 10. FIG. 2 is a schematic diagram of a light-emitting device according to some embodiments of the present disclosure, and FIG. 3 is a schematic diagram of a light-emitting device according to some other embodiments of the present disclosure. Each light-emitting device 23 includes a first electrode 231, multiple light-emitting units 234, and a second electrode 232 sequentially arranged in a direction away from the substrate 10. The first electrode 231 may serve as an anode of the light-emitting device 23 and the second electrode 232 may serve as a cathode of the light-emitting device 23. The light-emitting units 234 each includes a hole injection layer 2341, a hole transport layer 2342, a light-emitting layer 2343, an electron injection layer 2344, and an electron transport layer 2345 sequentially arranged in the direction away from the substrate 10. Optionally, the light-emitting device 23 is an OLED device in which case the light-emitting layer 2343 is made of an organic light-emitting material. Or, the light-emitting device 23 is a QLED (Quantum Dot Light Emitting Diodes) device, in which case the light-emitting layer 2343 is made of a quantum dot light-emitting material. In a same light-emitting device 23, at least two light-emitting layers 2343 emit light of different colors. It should be noted that the first electrode 231, the multiple light-emitting units 234, and the second electrode 232 being "sequentially arranged" in the direction away from the substrate 10 means that the multiple light-emitting units 234 are located on a side of the first electrode 231 away from the substrate 10, the multiple light-emitting units 234 are stacked sequentially, and the second electrode 232 is located on a side of the multiple light-emitting units 234 away from the substrate 10, which does not necessarily mean that the first electrode 231 and the light-emitting unit 234 are in contact with each other.

For example, at least one of the multiple light-emitting devices 23 may further include a cavity length adjusting layer 233. The cavity length adjusting layer 233 is positioned between the first electrode 231 and a light-emitting unit 234 closest to the first electrode 231.

The first electrode 231 is a reflective electrode configured to reflect light irradiated to the first electrode 231. The second electrode 232 is a transflective electrode configured to partially transmit and partially reflect light irradiated to the second electrode 232. A microcavity structure is formed between the first electrode 231 and the second electrode 232, and a cavity length of the microcavity structure is related to a thickness of the cavity length adjusting layer 233. When the thickness of the cavity length adjusting layer 233 is large, the cavity length of the microcavity structure is long, and when the thickness of the cavity length adjusting layer 233 is small, the cavity length of the microcavity structure is short. The light emitted by the light-emitting layers 2343 of the multiple light-emitting units 234 oscillates for multiple times in the microcavity structure, so that the light-emitting device 23 as a whole emits light with a band corresponding to the cavity length of the microcavity structure.

A microcavity effect refers to that an optical resonance cavity with dimensions in the micrometer or submicrometer scale uses the effects of reflection, total reflection, scattering or diffraction of light on an interface with discontinuous refractive index to confine light within the microcavity of the light-emitting device 23, allowing only light of specific wavelengths to be emitted. Therefore, the microcavity effect has a function of enhancing light with a certain wavelength while suppressing the emission of light with other wavelengths of, thereby increasing and narrowing the specific wavelength of light.

The color conversion layer includes multiple wavelength conversion units 24. Each of the wavelength conversion units 24 corresponds to one light-emitting device 23, and the light-emitting device 23 corresponding to the wavelength conversion unit 24 includes the above-mentioned cavity length adjusting layer 233. The wavelength conversion unit 24 is arranged on a light exit side of the light-emitting device 23, and the light exit side of the light-emitting device 23 is a side of the second electrode 232 away from the first electrode 231. The wavelength conversion unit 24 is configured to convert light which is irradiated to the wavelength conversion unit 24 and in a light absorption band of the light conversion unit into light of a target color and emits the light of the target color. A wavelength of the light of the target color emitted by the wavelength conversion unit 24 is larger than the light absorption band of the light conversion unit 24, that is, the wavelength conversion unit 24 converts low-wavelength light into high-wavelength light. It should be noted that the multiple wavelength conversion units 24 of the color conversion layer may be divided into multiple types, and the target colors of the different types of wavelength conversion units 24 may be different, that is, when the different types of wavelength conversion units 24 receive light within their respective light absorption bands, colors of the emitted light are different.

At least one light-emission peak in a light-emission band of the light-emitting device 23 is less than or equal to an intrinsic light-emission peak of a corresponding wavelength conversion unit 24, and the light absorption band of the wavelength conversion unit 24 is overlapped with the light-emission band of the light-emitting device 23.

The light absorption band of the wavelength conversion unit 24 refers to a wavelength range of light that can excite the wavelength conversion unit 24 to emit light. The intrinsic light-emission peak of the wavelength conversion unit 24 refers to a wavelength of light with the largest light intensity among the light emitted by the wavelength conversion unit 24 when being excited. For example, the wavelength conversion unit emits light in red band (i.e., 580 nm 680 nm) after being excited, and the intensity of light is the largest at a wavelength of 630 nm, so the intrinsic light-emission peak of the wavelength conversion unit is 630 nm.

It should be noted that the light-emission peak in the light-emission band of the light-emitting device 23 refers to a wavelength corresponding to a of the peak position of the curve in a spectral curve of the light-emitting device 23. Herein, the spectral curve of the light-emitting device 23 may have two peaks, that is, two light-emission peaks. Herein, at least one light-emission peak is less than or equal to the intrinsic light-emission peak of the wavelength conversion unit 24.

In some embodiments, a material of the wavelength conversion unit includes a quantum dot material, which is a number of extremely tiny semiconductor nanocrystals and is called new generation fluorescent nanomaterial. The quantum dot material has excellent characteristics such as adjustable light-emission color with size change, high light conversion efficiency, narrow half peak width of light-emission spectrum, etc. The quantum dot material can be excited by low-wavelength light to emit high-wavelength light.

In some embodiments, a color film layer may further be provided on a side of the color conversion layer away from the substrate 10. The color film layer includes multiple color filter portions 26r, 26b and 26g. Each wavelength conversion unit 24 corresponds to one color filter portion, and a color of the color filter portion is the same as a color of light emitted by the wavelength conversion unit 24.

In the embodiment of the present disclosure, the light-emitting device 23 includes multiple light-emitting layers 2343, and light-emission colors of at least two light-emitting layers 2343 are different, and the light-emitting device 23 includes a cavity length adjusting layer 233. By setting a thickness of the cavity length adjusting layer 233, a cavity length of the microcavity structure can be adjusted, so that at least one light-emission peak of the light-emitting device 23 is less than or equal to the intrinsic light-emission peak of the wavelength conversion unit 24, and the light absorption band of the wavelength conversion unit 24 is overlapped with the light-emission band of the light-emitting device 23, so as to ensure that the wavelength conversion unit 24 can be excited by the light emitted from the light-emitting device 23 and improve a utilization rate of the light emitted from the light-emitting device 23. Light that is not absorbed by the wavelength conversion unit 24 can directly pass through the color filter portion corresponding to the wavelength conversion unit 24, thereby improving light-emission brightness of a region where the wavelength conversion unit 24 is located.

In some embodiments, a portion of the light absorption band of the wavelength conversion unit 24 overlapped with the light-emission band of the light-emitting device 23 accounts for 50% to 100% of the light-emission band, and preferably, the portion of the light absorption band of the wavelength conversion unit 24 overlapped with the light-emission band of the light-emitting device 23 accounts for 80%, or 90%, or 95%, or 100% of the light-emission band, so as to maximize the utilization rate of the light emitted from the light-emitting device 23 to the greatest extent.

The display panel in the embodiment of the present disclosure is described in detail below with reference to the accompanying drawings.

Figure 4:
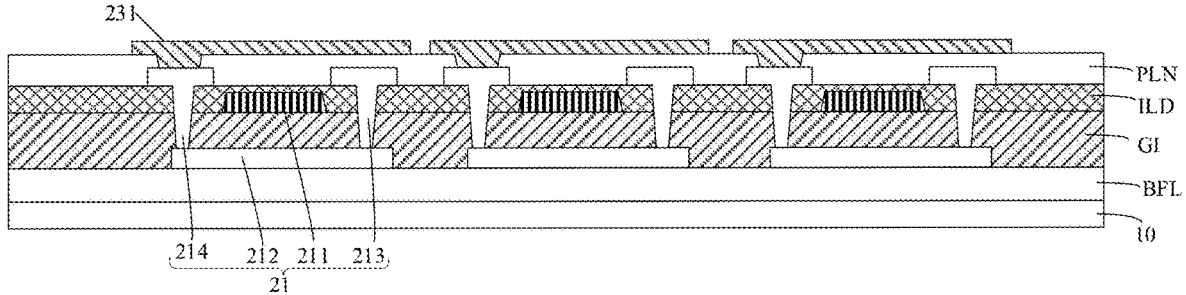
FIG. 4 is a schematic diagram of a first electrode and drive structure layer according to some embodiments of the present disclosure.

As shown in FIG. 1, a drive structure layer 20 is arranged on the substrate 10, and the drive structure layer 20 includes multiple pixel drive circuits corresponding to the light-emitting devices 23 one by one, and the pixel drive circuits are used for providing driving current for the light-emitting devices 23 to drive the light-emitting devices 23 to emit light. FIG. 4 is a schematic diagram of a first electrode and a drive structure layer according to some embodiments of the present disclosure. For example, the pixel drive circuit includes multiple thin film transistors 21. Each thin film transistor 21 includes a gate 211, an active layer 212, a source 213 and a drain 214. Taking a case in which the thin film transistor 21 being a top-gate type thin film transistor as an example, the active layer 212 is located between the gate 211 and the substrate 10. A material of the active layer 212 may include, for example, an inorganic semiconductor material (e.g. polysilicon, amorphous silicon etc.), an organic semiconductor material, an oxide semiconductor material. The active layer 212 includes a channel portion and a source connection portion and a drain connection portion located on two sides of the channel portion. The source connection portion is connected to the source 213 of the thin film transistor 21 and the drain connection portion is connected to the drain 214 of the thin film transistor 21. Both the source connection portion and the drain connection portion may be doped with impurities (e.g. N-type impurities or P-type impurities) with a higher impurity concentration than that of the channel portion. The channel portion is directly opposite to the gate 211 of the thin film transistor 21. When a voltage signal applied to the gate 211 of the thin film transistor 21 reaches a certain value, a carrier path is formed in the channel portion, causing the source 213 and drain 214 of the thin film transistor 21 to be conductive.

As shown in FIG. 4, a buffer layer BFL is disposed between the thin film transistor 21 and the substrate 10 for preventing or reducing diffusion of metal atoms and/or impurities from the substrate 10 into the active layer 212 of the thin film transistor 21. The buffer layer BFL may include an inorganic material such as silicon oxide, silicon nitride and/or silicon oxynitride, and may be formed as multilayers or a single layer.

As shown in FIG. 4, a gate insulating layer GI is disposed on a side of the active layer 212 away from the buffer layer BFL. A material of the gate insulating layer GI may include a silicon compound, a metal oxide. For example, the material of the gate insulating layer GI include silicon oxide nitride, silicon oxide, silicon nitride, silicon oxide carbide, silicon carbide nitride, aluminium oxide, aluminum nitride, tantalum oxide, hafnium oxide, zirconia, titanium oxide, and the like. In addition, the gate insulating layer GI may be a single layer or multilayers.

As shown in FIG. 4, the gate 211 of the thin film transistor 21 is provided on a side of the gate insulating layer GI away from the buffer layer BFL. A material of the gate 211 may include, for example, a metal, a metal alloy, a metal nitride, a conductive metal oxide, a transparent conductive material and the like. For example, the gate 211 may include gold, an alloy of gold, silver, an alloy of silver, aluminum, an alloy of aluminum, aluminum nitride, tungsten, tungsten nitride, copper, an alloy of copper, nickel, chromium, chromium nitride, molybdenum, an alloy of molybdenum, titanium, titanium nitride, platinum, tantalum, tantalum nitride, neodymium, scandium, strontium ruthenium oxide, zinc oxide, tin oxide, indium oxide, gallium oxide, indium tin oxide, indium zinc oxide, etc. The gate 211 may be in a single layer or multilayers.

As shown in FIG. 4, an interlayer insulating layer ILD is disposed on a side of the gate 211 away from the buffer layer BFL, and a material of the interlayer insulating layer ILD may include, for example, a silicon compound, a metal oxide or the like. Specifically, silicon compounds and metal oxides listed above may be selected, which will not be repeated here.

A source-drain conductive layer is provided on a side of the interlayer insulating layer ILD away from the buffer layer BFL. The source-drain conductive layer may include a source 213 and a drain 214 of each transistor, the source 213 is electrically connected to the source connection portion and the drain 214 is electrically connected to the drain connection portion. The source-drain conductive layer may include a metal, an alloy, a metal nitride, a conductive metal oxide, a transparent conductive material, etc. For example, the source-drain conductive layer may be a single layer or multilayers composed of a metal, such as Mo/Al/Mo or Ti/Al/Ti.

As shown in FIG. 4, a planarization layer PLN is provided on a side of the source-drain conductive layer away from the buffer layer BFL, and the planarization layer PLN may be made of an organic insulation material. The organic insulation material includes, for example, resin-based materials such as polyimide, epoxy resin, acrylic, polyester, photoresist, polyacrylate, polyamide, siloxane, etc. The first electrode 231 is arranged on the planarization layer PLN.

As shown in FIGS. 1 and 4, a pixel definition layer PDL is located on a side of the planarization layer PLN away from the buffer layer BFL, and the pixel definition layer PDL has multiple pixel openings. The light-emitting devices 23 correspond to the pixel openings one by one. Each light-emitting device 23 includes a first electrode 231, a cavity length adjusting layer 233, multiple light-emitting units 234, and a second electrode 232. The cavity length adjusting layer 233 is located on a side of the first electrode 231 away from the substrate 10, and the multiple light-emitting units 234 are located between the cavity length adjusting layer 233 and the second electrode 232.

Optionally, the first electrode 231 includes a first transparent conductive layer 231a and a metal reflective layer 231b which are stacked to perform a reflective function while reducing resistance of the first electrode 231. The metal reflective layer 231b is located on a side of the first transparent conductive layer 231a away from the substrate 10. The first transparent conductive layer 231a may be made of a transparent conductive material such as indium tin oxide (ITO), and a thickness of the first transparent conductive layer 231a is between 60 Å and 100 Å, for example, 80 Å. The metallic reflective layer 231b may be made of a material with good conductivity, such as silver or aluminum, and has a thickness between 900 Å and 1000 Å.

In one example, the cavity length adjusting layer 233 is made of a transparent conductive material including, for example, ITO. The cavity length adjusting layer 233 is in contact with the first electrode 231. In another example, the cavity length adjusting layer 233 is made of a transparent insulation material, which may include silicon nitride, silicon oxide, silicon oxynitride, etc. A second transparent conductive layer (not shown) is further provided on the side of the cavity length adjusting layer 233 away from the substrate 10. The second transparent conductive layer is electrically connected with the first electrode 231. The second transparent conductive layer may be made of a transparent conductive material such as ITO, and a thickness of the second transparent conductive layer is between 60 Å and 100 Å, for example, 80 Å.

Optionally, a material of the second electrode 232 includes magnesium and silver, a volume ratio of magnesium to silver is between 2:8 and 8:2, and a thickness of the second electrode 232 is between 120 nm and 180 nm. Or, the second electrode 232 is made of indium zinc oxide (IZO) and has a thickness between 80 nm and 500 nm.

Each light-emitting unit 234 includes a hole injection layer 2341, a hole transport layer 2342, a light-emitting layer 2343, an electron transport layer 2344 and an electron injection layer 2345 sequentially arranged in a direction away from the substrate 10. In a same light-emitting device 23, a charge generation layer 235 is provided between two adjacent light-emitting units 234.

Optionally, assuming that the quantity of light-emitting units 234 in each light-emitting device 23 is N and N is an integer greater than 1, the light-emitting layers 2343 of the i-th light-emitting units 234 of the multiple light-emitting devices 23 are of an integral structure; i is an integer, N>1, 0<i<N. Herein, the i-th light-emitting unit 234 is an i-th light-emitting unit 234 arranged along the direction away from the substrate 10. In addition, the hole injection layers 2341 of the i-th light-emitting units 234 of the multiple light-emitting devices 23 may be of an integral structure, the hole transport layers 2342 of the i-th light-emitting units 234 of the multiple light-emitting devices 23 may be of an integral structure, the electron transport layers 2344 of the i-th light-emitting units 234 of the multiple light-emitting devices 23 may be of an integral structure, the electron injection layers 2345 of the i-th light emitting units 234 of the multiple light emitting devices 23 may be of an integral structure, and the second electrodes 232 of the multiple light emitting devices 23 may be of an integral structure.

In some embodiments, the multiple light-emitting units 234 in each light-emitting device 23 includes two blue light-emitting units and a yellow light-emitting unit located between the two blue light-emitting units, that is, the multiple light-emitting layers in each light-emitting device 23 includes two blue light-emitting layers and a yellow light-emitting layer located between the two blue light-emitting layers. Or, the multiple light-emitting units 234 of each light-emitting device 23 includes two blue light-emitting units and a green light-emitting unit located between the two blue light-emitting units, that is, the multiple light-emitting layers 2343 in each light-emitting unit 234 includes two blue light-emitting layers and a green light-emitting layer located between the two blue light-emitting layers. Or, the multiple light-emitting units 234 in each light-emitting device 23 includes a red light-emitting unit, a green light-emitting unit, and a blue light-emitting unit, that is, the multiple light-emitting layers in each light-emitting device 23 include a red light-emitting layer, a green light-emitting layer, and a blue light-emitting layer.

As shown in FIG. 1, a first encapsulation layer 25 is arranged on a side of the multiple light-emitting devices 23 away from the substrate 10 for encapsulating the multiple light-emitting devices 23 to prevent moisture and/or oxygen in external environment from eroding the light-emitting devices 23. In some embodiments, the first encapsulation layer 25 includes a first inorganic encapsulation layer 25a, a second inorganic encapsulation layer 25b, and an organic encapsulation layer 25c. The second inorganic encapsulation layer 25b is located on a side of the first inorganic encapsulation layer 25a away from the substrate 10, and the organic encapsulation layer 25c is located between the first inorganic encapsulation layer 25a and the second inorganic encapsulation layer 25b. Both the first inorganic encapsulation layer 25a and the second inorganic encapsulation layer 25b may be made of an inorganic material with high compactness such as silicon oxynitride (SiON), silicon oxide (SiOx), and silicon nitride (SiNx). The organic encapsulation layer 25c may be made of a polymer material containing a desiccant or of a polymer material capable of blocking moisture. For example, a polymer resin is used so that stresses of the first inorganic encapsulation layer 25a and the second inorganic encapsulation layer 25b can be relieved, and a water-absorbent material such as a desiccant can be included to absorb water, oxygen, and other substances that intrude into the interior.

Optionally, a light extraction layer and a protective layer (not shown) may further be provided between each light-emitting device 23 and the first encapsulation layer 25, and the light extraction layer may be made of a material with a large refractive index so as to facilitate extracting light emitted by the light-emitting device 23. The protective layer is provided between the light extraction layer and the encapsulation layer to prevent manufacturing processes of the encapsulation layer from affecting the light-emitting device 23. A material of the protective layer may include lithium fluoride (Lif).

The color conversion layer and an accommodation structure layer 27 are provided on a side of the first encapsulation layer 25 away from the substrate 10, as shown in FIG. 1, and the color conversion layer includes multiple wavelength conversion units 24 and multiple scattering units 241. For example, the multiple wavelength conversion units 24 are divided into multiple types and target colors corresponding to different types of wavelength conversion units 24 are different. For example, the multiple wavelength conversion units 24 include a red wavelength conversion unit 24r and a green wavelength conversion unit 24g. A color of light emitted from the red wavelength conversion unit 24r is red and a color of light emitted from the green wavelength conversion unit 24g is green. For example, the multiple wavelength conversion units 24 and the multiple scattering units 241 in the color conversion layer constitute multiple repeativr groups, each of which includes one red wavelength conversion unit 24r, one green wavelength conversion unit 24g and one scattering unit 241. Each red wavelength conversion unit 24r, each green wavelength conversion units 24g and each scattering unit 241 correspond to one light-emitting device 23. Each light-emitting device 23 corresponds to one wavelength conversion unit or one scattering unit 241. A material of the red wavelength conversion units 24r may include a red quantum dot material, a material of the green wavelength conversion units 24g may include a green quantum dot material, and a material of the scattering units 241 may include scattering particles. The quantum dot material may be one or more of ZnCdSe2, CdSe, CdTe, InP and InAs. The quantum dots may not be limited to the above materials and may be selected from Group II-VI compounds, Group III-V compounds, Group IV-VI compounds, Group IV elements, Group IV compounds, and/or combinations thereof.

The accommodation structure layer 27 has multiple accommodation grooves. Each accommodation groove is configured to accommodate one wavelength conversion unit 24 or one scattering unit 241.

A second encapsulation layer 28 is arranged on a side of the color conversion layer away from the substrate 10 for encapsulating the color conversion layer.

A color film layer and a black matrix BM are arranged on a side of the color conversion layer away from the substrate 10. The color film layer includes multiple color filter portions 26r, 26b and 26g, each scattering unit 241 and each wavelength conversion unit 24 corresponds to one color filter portion 26r/26b/26g, and a color of the color filter portion is the same as that of its corresponding scattering unit 241 or wavelength conversion unit 24. For example, a color filter portion 26r corresponds to the red wavelength conversion unit, a color filter portion 26g corresponds to the green wavelength conversion unit, and the scattering unit 241 corresponds to the color filter portion 26b, and any two adjacent color filter portions are separated by the black matrix BM.

In some embodiments, light-emission bands of the light-emitting devices 23 corresponding to different types of wavelength conversion units 24 are different. For example, a light-emission band of a light-emitting device 23 corresponding to the red wavelength conversion unit 24r includes [380 nm, 480 nm], and a light-emission band of a light-emitting device 23 corresponding to the green wavelength conversion unit 24g includes [380 nm, 580 nm]. Each scattering unit 241 corresponds to one light-emitting device 23, and a light-emission band of the light-emitting device 23 corresponding to the scattering unit 241 includes [380 nm, 480 nm].

In some embodiments, thicknesses of the cavity length adjusting layers 233 corresponding to different types of wavelength conversion units 24 may be different, so that the light-emission bands of the light-emitting devices 23 corresponding to different types of wavelength conversion units 24 may be different. For the scattering unit 241, its corresponding light-emitting device 23 may include the above-mentioned cavity length adjusting layer 233 or may not include the above-mentioned cavity length adjusting layer 233. When the light-emitting device 23 corresponding to the scattering unit 241 includes the above-mentioned cavity length adjusting layer 233, the thickness of the cavity length adjusting layer 233 may be adjusted so that the light-emission band of the light-emitting device 23 corresponding to the scattering unit 241 includes [380 nm, 480 nm], for example, the light-emitting device 23 corresponding to the scattering unit 241 emits blue light. When the light-emitting device 23 corresponding to the scattering unit 241 does not include the cavity length adjusting layer 233, the light emitted from the light-emitting device 23 may include light of other bands in addition to the blue light in [380 nm, 480 nm] band. In this case, the color filter 26b corresponding to the scattering unit 241 may filter the light of other bands. Moreover, when the light-emitting device 23 does not include the cavity length adjusting layer 233, the manufacturing processes of the light-emitting device 23 can be simplified.

In some embodiments, the multiple light-emitting layers in the light-emitting device 23 include two blue light-emitting layers and a green light-emitting layer located between the two blue light-emitting layers. FIG. 5 is a peak position diagram of a light emitting device when it includes two blue light-emitting layers and one green light-emitting layer, with the horizontal axis representing a wavelength and the vertical axis representing a normalized light intensity value. Each curve corresponds to a cavity length adjusting layer 233 with a certain thickness, and each curve represents a curve of an intensity of light emitted from the light-emitting device 23 varying with the wavelength when the cavity length adjusting layer 233 reaches a corresponding thickness. When the thickness of the cavity length adjusting layer 233 is in a range of [50 nm, 60 nm], a light-emission band of the light-emitting device 23 is [440 nm, 580 nm], and a light-emission peak is in a range of [460 nm, 530 nm]. When the thickness of the cavity length adjusting layer 233 is 70 nm, the light-emission band of the light-emitting device 23 is [440 nm, 580 nm], and two peaks appear in a spectral curve corresponding to the light-emitting device 23, that is, the light-emitting device 23 has two light-emission peaks, one of the two light-emission peaks is in a range of [450 nm, 460 nm] and the other of yje two light-emission peaks is in a range of [535 nm, 545 nm]. When the thickness of the cavity length adjusting layer 233 is 80 nm, the light-emission band of the light-emitting device 23 is [440 nm, 580 nm], and two peaks appear in the spectral curve corresponding to the light-emitting device 23, that is, the light-emitting device 23 has two light-emission peaks in ranges of [450 nm, 460 nm] and [545 nm, 555 nm], respectively. When the thickness of the cavity length adjusting layer 233 is 90 nm, the light-emission band of the light-emitting device 23 includes [435 nm, 480 nm] and [520 nm, 580 nm], with a first light-emission peak in the range of [445 nm, 455 nm] and a second light-emission peak in the range of [555 nm, 560 nm]. When the thickness of the cavity length adjusting layer 233 is 100 nm, the light-emission band of the light-emitting device 23 is [450 nm, 480 nm], and the light-emission peak is in a range of [445 nm, 455 nm]. When the thickness of the cavity length adjusting layer 233 is 110 nm, the light-emission band of the light-emitting device 23 is [450 nm, 480 nm], and the light-emission peak is in a range of [455 nm, 465 nm]. When the thickness of the cavity length adjusting layer 233 is 120 nm, the light-emission band of the light-emitting device 23 is [445 nm, 480 nm], and the light-emission peak is in a range of [465 nm, 470 nm]. When the thickness of the cavity length adjusting layer 233 is 130 nm, the light-emission band of the light-emitting device 23 is [455 nm, 530 nm], and the light-emission peak is in the range of [470 nm, 480 nm]. When the thickness of the cavity length adjusting layer 233 is 140 nm, the light-emission band of the light-emitting device 23 is [455 nm, 540 nm], and the light-emission peak is in a range of [480 nm, 490 nm].

Figure 6:
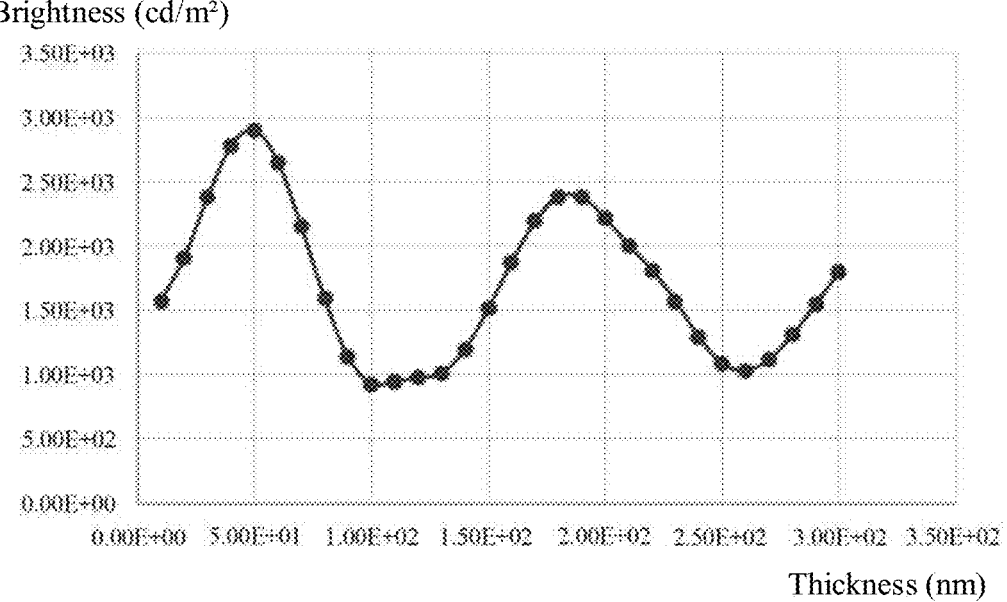
FIG. 6 is a curve graph showing relationship between an overall brightness of a light-emitting device and a thickness of a cavity length adjusting layer when the light-emitting device includes two blue light-emitting layers and one green light-emitting layer.
Figure 7:
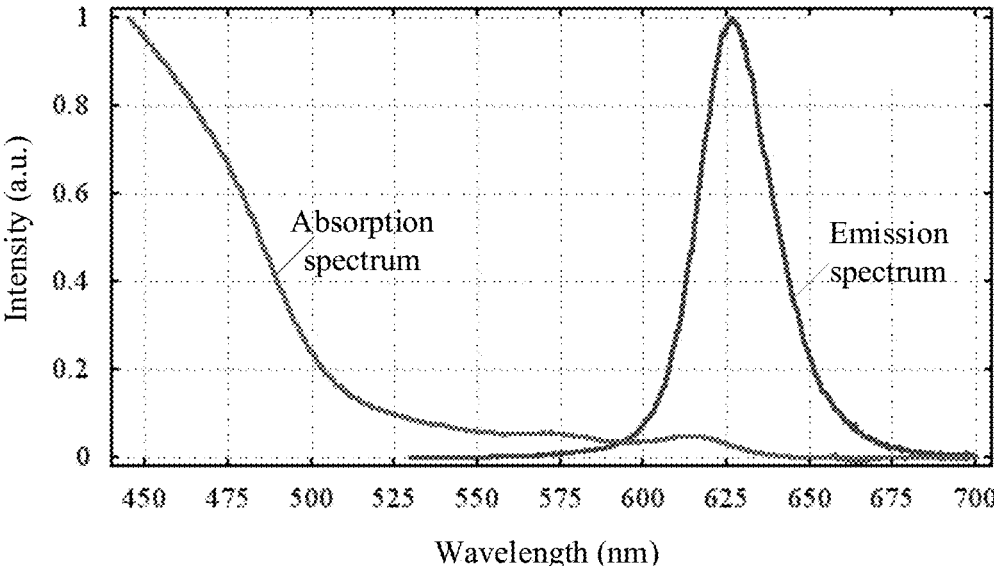
FIG. 7 is a graph of an absorption spectrum curve and an emission spectrum curve of a red wavelength conversion unit.
Figure 8:
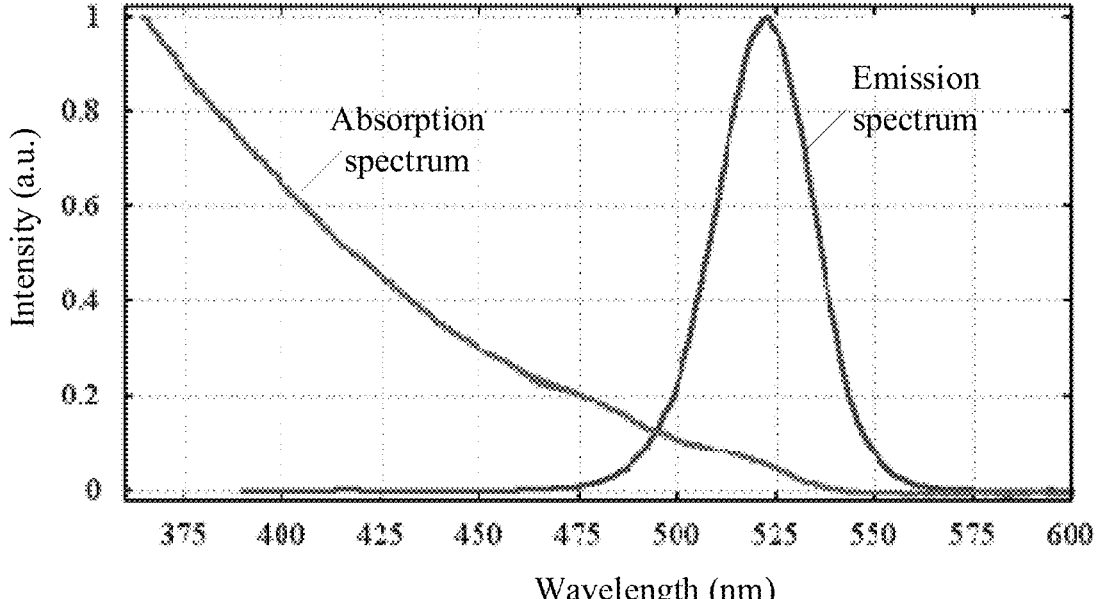
FIG. 8 is a graph of an absorption spectrum curve and an emission spectrum curve of a green wavelength conversion unit.

FIG. 6 is a curve graph showing relationship between an overall brightness of a light-emitting device and a thickness of a cavity length adjusting layer when the light-emitting device includes two blue light-emitting layers and one green light-emitting layer. In FIG. 6, the horizontal axis represents a wavelength and a vertical axis represents the brightness. FIG. 7 is a graph of an absorption spectrum curve and an emission spectrum curve of a red wavelength conversion unit, and FIG. 8 is a graph of an absorption spectrum curve and an emission spectrum curve of a green wavelength conversion unit. In FIGS. 7 and 8, the horizontal axis represents a wavelength and the vertical axis represents a light intensity. As can be seen from FIG. 7, the light absorption band of the red wavelength conversion unit 24r is 380 nm to 650 nm, and the intrinsic light-emission peak is 625 nm. As can be seen from FIG. 8, the light absorption band of the green wavelength conversion unit 24g is 380 nm to 540 nm, and the intrinsic light-emission peak is 525 nm.

According to the curves in FIGS. 5 to 8, when the light-emitting device 23 includes two blue light-emitting layers and one green light-emitting layer, the thickness of the cavity length adjusting layer 233 in the light-emitting device 23 corresponding to the red wavelength conversion unit 24r may be set in the range of [100 nm, 120 nm], for example, 100 nm or 110 nm, so that the light-emission band of the light-emitting device 23 corresponding to the red wavelength conversion unit 24r includes [380 nm, 480 nm], that is, the emitted light includes blue light, and the light-emission peak is in the range of [450 nm, 470 nm]. The thickness of the cavity length adjusting layer 233 in the light-emitting device 23 corresponding to the green wavelength conversion unit 24g is set in the range of [70 nm, 90 nm], for example, 70 nm or 80 nm or 90 nm, so that the light emitted by the light-emitting device 23 corresponding to the green wavelength conversion unit 24g is in the range of [380 nm, 580 nm], that is, the emitted light includes blue light and green light. When the cavity length adjusting layer 233 is included in the light-emitting device 23 corresponding to the scattering unit 241, the thickness of the cavity length adjusting layer 233 in the light-emitting device 23 corresponding to the scattering unit 241 may be set in the range of [100 nm, 120 nm], for example, 100 nm or 110 nm or 120 nm, so that the light emitted by the light-emitting device 23 corresponding to the scattering unit 241 is in the range of [380 nm, 480 nm], that is, blue light is emitted. In this way, at least one light-emission peak of the light-emitting device 23 corresponding to the wavelength conversion unit 24 is less than or equal to the intrinsic light-emission peak of the wavelength conversion unit 24, and the light absorption band of the wavelength conversion unit 24 is overlapped with the light-emission band of the corresponding light-emitting device 23, while ensuring a high brightness of the light-emitting device 23.

In some other embodiments, the multiple light-emitting layers 2343 in the light-emitting device 23 include one blue light-emitting layer and one yellow light-emitting layer. For example, the yellow light-emitting layer is located on a side of the blue light-emitting layer away from the substrate 10. FIG. 9 is a peak position diagram of a light emitting device when it includes one blue light-emitting layer and one yellow light-emitting layer. The horizontal axis in FIG. 9 represents a wavelength and the vertical axis represents a normalized light intensity value. As shown in FIG. 9, when a thickness of the cavity length adjusting layer 233 is 100 nm, a light-emission band of the light-emitting device 23 is [400 nm, 480 nm]. When the thickness of the cavity length adjusting layer 233 is 110 nm, the light-emission band of the light-emitting device 23 is [420 nm, 480 nm]. When the thickness of the cavity length adjusting layer 233 is 120 nm, the light-emission band of the light-emitting device 23 is [430 nm, 480 nm]. When the thickness of the cavity length adjusting layer 233 is in the range of [130 nm, 150 nm], the light-emission band of the light-emitting device 23 is [430 nm, 580 nm]. When the thickness of the cavity length adjusting layer 233 is in the range of (150 nm, 170 nm], the light-emission bands of the light-emitting device 23 include [380 nm, 480 nm] and [580 nm, 680 nm].

Figure 10:
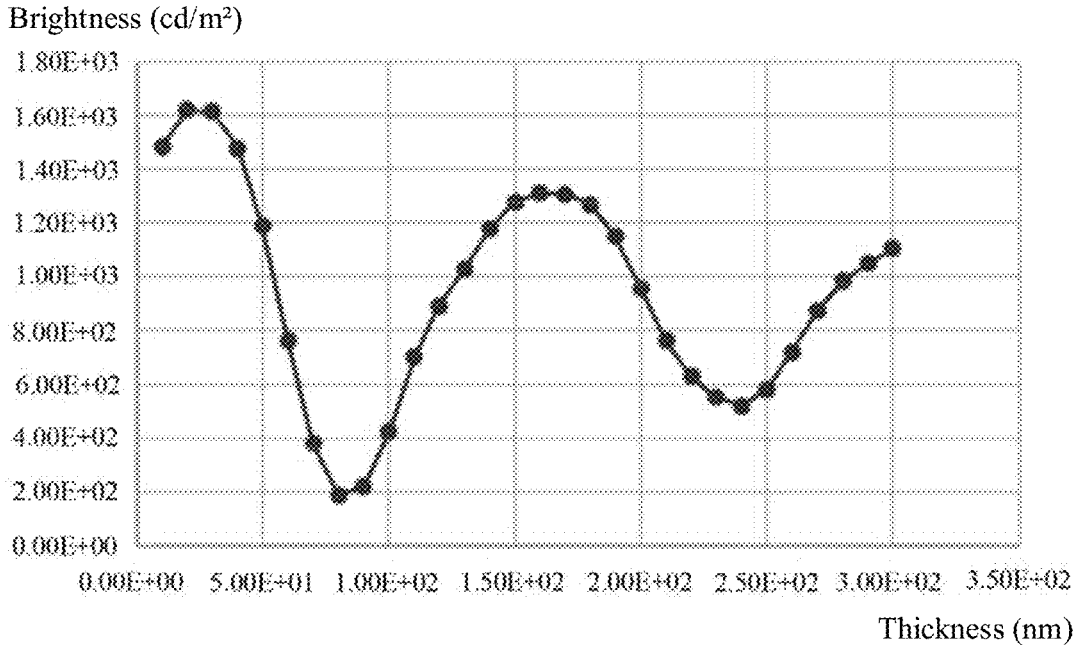
FIG. 10 is a curve graph showing relationship between an overall brightness of a light-emitting device and a thickness of a cavity length adjusting layer when the light-emitting device includes one blue light-emitting layer and one yellow light-emitting layer.

FIG. 10 is a curve graph showing relationship between an overall brightness of a light-emitting device and a thickness of a cavity length adjusting layer when the light-emitting device includes one blue light-emitting layer and one yellow light-emitting layer. The horizontal axis in FIG. 10 represents the thickness of the cavity length adjusting layer, and the vertical axis represents the light-emission brightness of the light-emitting device. Referring to the curves in FIG. 7 to FIG. 10, when each light-emitting device 23 includes a blue light-emitting layer and a yellow light-emitting layer, a thickness of a cavity length adjusting layer 233 in a light-emitting device 23 corresponding to the red wavelength conversion unit 24r may be set in the range of [150 nm, 170 nm], for example, 150 nm or 160 nm or 170 nm, so that the light-emission band of the light-emitting device 23 corresponding to the red wavelength conversion unit 24r includes: [380 nm, 480 nm] band and [580 nm, 680 nm] band, that is, the emitted light includes blue light and red light, and the light-emission peak of the light-emitting device 23 corresponding to the red wavelength conversion unit 24r is less than 580 nm. A thickness of a cavity length adjusting layer 233 in a light-emitting device 23 corresponding to a green wavelength conversion unit 24g is set in the range of [130 nm, 150 nm), for example, 130 nm or 135 nm or 140 nm or 145 nm, so that the light-emission band of the light-emitting device 23 corresponding to the green wavelength conversion unit 24g includes [380 nm, 580 nm], that is, the emitted light includes blue light and green light, and at least one light-emission peak of the light-emitting device 23 corresponding to the green wavelength conversion unit 24g is less than 525 nm. When the cavity length adjusting layer 233 is provided in the light-emitting device 23 corresponding to the scattering unit 241, a thickness of the cavity length adjusting layer 233 in the light-emitting device 23 corresponding to the scattering unit 241 may be set in the range of [100 nm, 120 nm], for example, 100 nm, 110 nm or 120 nm, so that the wavelength of the emitted light of the light-emitting device 23 corresponding to the scattering unit 241 is in the range of [380 nm, 480 nm], that is, the emitted light is blue light. In this way, at least one light-emission peak of the light-emitting device 23 corresponding to the wavelength conversion unit is less than or equal to the intrinsic light-emission peak of the wavelength conversion unit 24, and the light absorption band of the wavelength conversion unit is overlapped with the light-emission band of the corresponding light-emitting device 23, while the brightness of the light-emitting device 23 can be ensured to be high.

Figure 11:
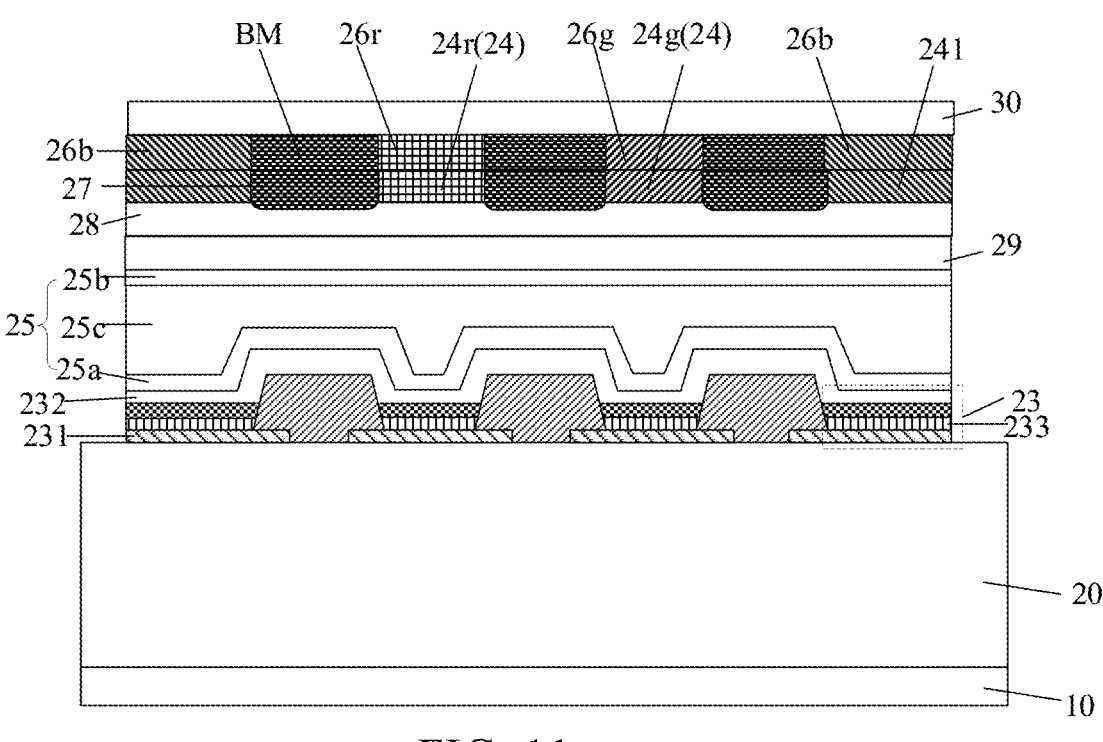
FIG. 11 is a schematic diagram of a display panel according to some other embodiments of the present disclosure.

FIG. 11 is a schematic diagram of a display panel according to some other embodiments of the present disclosure, the display panel shown in FIG. 11 is similar to the display panel in FIG. 1, except that the display panel in FIG. 1 has an On-EL structure (i.e., the color conversion layer is directly manufactured on the first encapsulation layer 25), while the display panel in FIG. 11 has a cell-aligned structure, i.e., the display panel further includes a cover plate 30 and a filling layer 29, and the cover plate 30 is disposed opposite to the substrate 10. The color conversion layer is provided on a side of the cover plate 30 facing the substrate 10, and the second encapsulation layer 28 is provided on a side of the color conversion layer away from the cover plate 30 for encapsulating the color conversion layer. The first encapsulation layer 25 and the second encapsulation layer 28 are connected to each other by the filling layer 29 between them.

FIG. 12 is a flowchart of a method for manufacturing a display panel according to some embodiments of the present disclosure. The method is used for manufacturing the display panel in the above embodiments. As shown in FIG. 12, the manufacturing method includes:

S10, forming multiple light-emitting devices on a substrate, each of the light-emitting devices includes a first electrode, multiple light-emitting units and a second electrode arranged sequentially in a direction away from the substrate; herein, the first electrode is a reflection electrode, the second electrode is a transflective electrode, a microcavity structure is formed between the first electrode and the second electrode, and a cavity length of the microcavity structure is related to a thickness of the cavity length adjusting layer; each light-emitting unit includes a light-emitting layer, and light emitted by the light-emitting layers of the multiple light-emitting units oscillate several times in the microcavity structure, so that the light-emitting device emits light with a band corresponding to the cavity length of the microcavity structure; in a same light-emitting device, at least two light-emitting layers have different light-emission colors. At least one of the light-emitting devices further includes a cavity length adjusting layer positioned between the first electrode and a light-emitting unit immediately adjacent to the first electrode.

S20, forming a color conversion layer, the color conversion layer includes multiple wavelength conversion units, each of which corresponds to one light-emitting device having the cavity length adjusting layer, and the wavelength conversion unit is arranged on a light exit side of the light-emitting device for converting light which is irradiated to the wavelength conversion unit and in the light absorption band of the wavelength conversion unit into light of a target color and emitting the light of the target color.

At least one light-emission peak in the light-emission band of the light-emitting device is less than or equal to an intrinsic light-emission peak of the corresponding wavelength conversion unit, and the light absorption band of the wavelength conversion unit is overlapped with the light-emission band of the light-emitting device.

Before step S10, the method may further include: forming a drive structure layer on the substrate, the drive structure layer includes multiple pixel circuits, each pixel circuit includes multiple thin film transistors, and the pixel circuits correspond to the light-emitting devices one by one, for providing a driving current for the corresponding light-emitting devices.

In some embodiments, the multiple light-emitting devices includes multiple first light-emitting devices, multiple second light-emitting devices, and multiple third light-emitting devices; A thickness of a cavity length adjusting layer in the first light-emitting device is a first thickness, a thickness of a cavity length adjusting layer in the second light-emitting device is a second thickness, a thickness of a cavity length adjusting layer in the third light-emitting device is a third thickness, the second thickness is greater than the first thickness, and the third thickness is greater than the second thickness.

FIGS. 13A to 13H are schematic diagrams of a process of step S10 in the method for manufacturing the display panel according to some embodiments of the present disclosure, as shown in FIGS. 13A to 13H, and step S10 specifically includes:

S11, forming, on the substrate 10, a conductive material layer 231a for manufacturing the first electrode, for example, the conductive material layer 231a includes a first transparent conductive material layer and a metal material layer.

S121, forming a first cavity length adjusting film layer 233a with a first thickness.

S13, forming a second cavity length adjusting sub-layer 2332 with a fourth thickness at a position corresponding to each second light-emitting device; herein, the second cavity length adjusting sub-layer 2332 is located on a side of the first cavity length adjusting film layer 233a away from the substrate 10. The fourth thickness is a difference between the first thickness and the second thickness.

Herein, step S13 may include:

S131, forming a first photoresist layer PR1, as shown in FIG. 13A.

S132, forming a first via V1 on the first photoresist layer PR1 at a position corresponding to each second light-emitting device.

S133, as shown in FIG. 13B, forming a second cavity length adjusting film layer 233b with a fourth thickness, with a part of the second cavity length adjusting film layer 233b being located in the first via V1, and the other part of the second cavity length adjusting film layer 233b being located on a surface of the first photoresist layer PR1 away from the substrate 10.

S134, as shown in FIG. 13C, removing the first photoresist layer PR1 to remove the second cavity length adjusting film 233b on the first photoresist layer PR1, with the second cavity length adjusting film 233b in the first via V1 serving as the second cavity length adjusting sub-layer 2332.

After step S13, step S14 is carried out: forming a third cavity length adjusting sub-layer with a fifth thickness at a position corresponding to each third light-emitting device. The fifth thickness is a difference between the third thickness and the first thickness.

Herein, step S14 may include:

S141, as shown in FIG. 13D, forming a second photoresist layer PR2, and forming a second via V2 on the second photoresist layer PR2 at a position corresponding to each third light-emitting device.

Figure 13E:
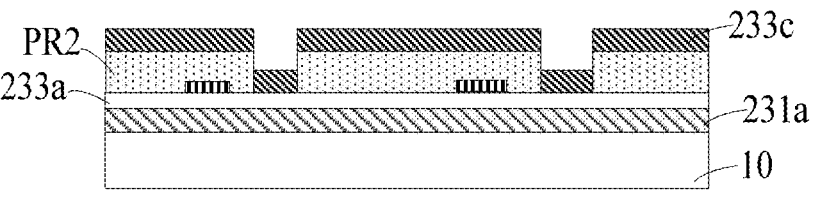

S143, as shown in FIG. 13E, forming a third cavity length adjusting film layer 233c with a fifth thickness, with a part of the third cavity length adjusting film layer 233c being located in the second via V2, and the other part of the third cavity length adjusting film layer 233c being located on the surface of the second photoresist layer PR2 away from the substrate 10.

Figure 13F:
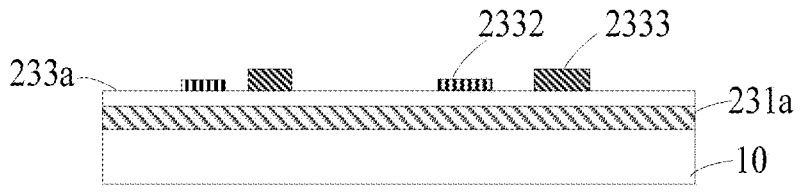

S144, as shown in FIG. 13F, removing the second photoresist layer PR2 to remove the third cavity length adjusting film layer on the second photoresist layer PR2, with the third cavity length adjusting film layer 233c in the second via V2 serving as the third cavity length adjusting sub-layer 2333.

Figure 13G:
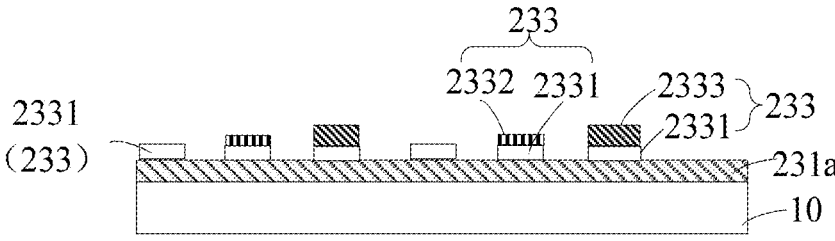

Thereafter, step S122 is carried out: as shown in FIG. 13G, performing a patterning process on the first cavity length adjusting film layer 233a to form a first cavity length adjusting sub-layer 2331 with the first thickness at the position of each light-emitting device.

Herein, steps S121 and S122 are steps for manufacturing the first cavity length adjusting sub-layer 2331, wherein the first cavity length adjusting sub-layer 2331 at the position where the first light-emitting device is located serves as the cavity length adjusting layer 233 of the first light-emitting device. The first cavity length adjusting sub-layer 2331 and the second cavity length adjusting sub-layer 2332 at the position where the second light-emitting device is located together serve as the cavity length adjusting layer 233 of the second light-emitting device. The first cavity length adjusting sub-layer 2331 and the third cavity length adjusting sub-layer 2333 at the position where the third light-emitting device is located together serve as the cavity length adjusting layer 233 of the third light-emitting device.

Figure 13H:
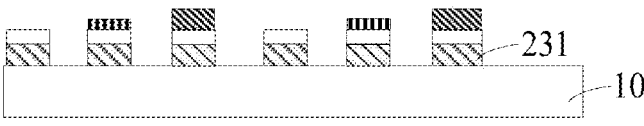

Thereafter, step S15 is carried out: performing a photolithographic patterning process on the conductive material layer 231a to form the first electrode 231 of each light-emitting device, as shown in FIG. 13H.

It should be noted that the method for manufacturing the above-mentioned light-emitting device is only schematic and multiple light-emitting devices may be formed by other manufacturing steps or manufacturing sequences. For example, before step S13, S122 is carried out. For example, step S15 is carried out between step S11 and step S121.

When the display panel has the structure shown in FIG. 1, the manufacturing method thereof may further include forming a first encapsulation layer after forming multiple light-emitting devices and before forming a color conversion layer; after forming the color conversion layer, forming a second encapsulation layer and a color film layer sequentially. When the display panel has the structure shown in FIG. 11, multiple light-emitting devices may be formed on the substrate, the first encapsulation layer is formed on a side of the multiple light-emitting devices away from the substrate; the color film layer, the color conversion layer and the second encapsulation layer located on a side of the color conversion layer away from a cover plate are formed on the cover plate. Thereafter, the substrate of the formed light-emitting device and the cover plate formed with the color conversion layer are arranged in alignment, and the first encapsulation layer and the second encapsulation layer are connected to each other by a filling layer.

An embodiment of the present disclosure further provides a display apparatus including the display panel of the aforementioned embodiment. The display device may be any product or component with a display function, such as a mobile phone, a tablet computer, a television, a display, a laptop computer, a digital photo frame, or a navigator.

It is to be understood that the above embodiments are only exemplary embodiments employed for the purpose of illustrating the principles of the present disclosure, however the present disclosure is not limited thereto. For those of ordinary skills in the art, various modifications and improvements may be made without departing from the spirit and essence of the present disclosure, and these modifications and improvements are also considered to be within the scope of the present disclosure.

The invention claimed is:

1. A display panel comprising:
a plurality of light-emitting devices arranged on a substrate, each of the light-emitting devices comprises a first electrode, a plurality of light-emitting units, and a second electrode sequentially arranged in a direction away from the substrate; wherein the first electrode is a reflection electrode, the second electrode is a transflective electrode, and a microcavity structure is formed between the first electrode and the second electrode; the light-emitting units each comprise a light-emitting layer, light-emission colors of at least two light-emitting layers in a same light-emitting device are different; at least one of the light-emitting devices further comprises a cavity length adjusting layer positioned between the first electrode and a light-emitting unit immediately adjacent to the first electrode;
a color conversion layer, which comprises a plurality of wavelength conversion units, wherein each of the wavelength conversion units corresponds to one light-emitting device having the cavity length adjusting layer, and the wavelength conversion unit is arranged on a light exit side of the light-emitting device, and is configured to convert light which is irradiated to the wavelength conversion unit and in a light absorption band of the wavelength conversion unit into light of a target color and emit the light of the target color;
wherein at least one light-emission peak in a light-emission band of the light-emitting device is less than or equal to an intrinsic light-emission peak of a corresponding wavelength conversion unit, and the light absorption band of the wavelength conversion unit is overlapped with the light-emission band of the light-emitting device.

2. The display panel according to claim 1, wherein a portion of the light absorption band of the wavelength conversion unit overlapped with the light-emission band of the light-emitting device accounts for 50% to 100% of the light-emission band.

3. The display panel according to claim 1, wherein the plurality of wavelength conversion units of the color conversion layer are divided into a plurality of types, target colors corresponding to different types of wavelength conversion units are different, and light-emission bands of light-emitting devices corresponding to different types of wavelength conversion units are different.

4. The display panel according to claim 3, wherein the plurality of types of wavelength conversion units comprises a red wavelength conversion unit and a green wavelength conversion unit, and a target color corresponding to the red wavelength conversion unit is red, and a target color corresponding to the green wavelength conversion unit is green,
a light-emission band of a light-emitting device corresponding to the red wavelength conversion unit comprises [380 nm, 480 nm]; a light-emission band of a light-emitting device corresponding to the green wavelength conversion unit comprises [380 nm, 580 nm]; and
the color conversion layer further comprises a plurality of scattering units, each of the plurality of scattering units corresponds to one light-emitting device, and a light-emission band of a light-emitting device corresponding to a scattering unit comprises [380 nm, 480 nm].

5. The display panel according to claim 4, wherein thicknesses of the cavity length adjusting layers corresponding to different types of wavelength conversion units are different.

6. The display panel according to claim 5, wherein a plurality of light-emitting layers in each light-emitting device comprises: two blue light-emitting layers and a green light-emitting layer positioned between the two blue light-emitting layers;
a thickness of a cavity length adjusting layer in the light-emitting device corresponding to the red wavelength conversion unit is within a range of [100 nm, 120 nm], so that a light-emission band of the light-emitting device corresponding to the red wavelength conversion unit comprises [380 nm, 480 nm];
a thickness of a cavity length adjusting layer in the light-emitting device corresponding to the green wavelength conversion unit is in a range of [70 nm, 90 nm], so that a light-emission band of the light-emitting device corresponding to the green wavelength conversion unit comprises [380 nm, 580 nm].

7. The display panel according to claim 5, wherein a plurality of light-emitting layers in each light-emitting device comprises: a blue light-emitting layer and a yellow light-emitting layer;
a thickness of a cavity length adjusting layer in the light-emitting device corresponding to the red wavelength conversion unit is within a range of [150 nm, 170 nm], so that a light-emission band of the light-emitting device corresponding to the red wavelength conversion unit comprises [380 nm, 480 nm] and [580 nm, 680 nm];
a thickness of a cavity length adjusting layer in the light-emitting device corresponding to the green wavelength conversion unit is in a range of [130 nm, 150 nm), so that a light-emission band of the light-emitting device corresponding to the green wavelength conversion unit comprises [380 nm, 580 nm].

8. The display panel according to claim 1, wherein a material of the wavelength conversion units comprises a quantum dot material.

9. The display panel according to claim 1, wherein the first electrode comprises a first transparent conductive layer and a metal reflective layer located on a side of the first transparent conductive layer away from the substrate.

10. The display panel according to claim 9, wherein the cavity length adjusting layer is made of a transparent conductive material; or the cavity length adjusting layer is made of a transparent insulation material, and a second transparent conductive layer is further provided on a side of the cavity length adjusting layer away from the substrate, an orthographic projection of the second transparent conductive layer on the substrate extends beyond an orthographic projection of the cavity length adjusting layer on the substrate, and a part of the second transparent conductive layer that extends beyond the cavity length adjusting layer is electrically connected with the first electrode.

11. The display panel according to claim 1, further comprising: a color film layer arranged on a side of the color conversion layer away from the substrate, the color film layer comprises a plurality of color filter portions, each of the scattering units and each of the wavelength conversion units correspond to one of the color filter portions, and a color of the color filter portion is the same as a color of light emitted from its corresponding scattering portion or wavelength conversion unit.

12. The display panel according to claim 1, wherein each light-emitting device comprises N light-emitting units arranged sequentially in the direction away from the substrate, wherein light-emitting layers of i-th light-emitting units of the plurality of light-emitting devices is of an integral structure; N and i are both integers, N>1, 0<i<N.

13. The display panel according to claim 1, wherein a charge generation layer is provided between every two adjacent light-emitting units in a same light-emitting device.

14. The display panel according to claim 1, further comprising: a first encapsulation layer and a second encapsulation layer;

the first encapsulation layer is arranged at a side of the plurality of light-emitting devices away from the substrate, and is configured to encapsulate the plurality of light-emitting devices;

the color conversion layer is arranged on a side of the first encapsulation layer away from the substrate;

the second encapsulation layer is arranged on a side of the color conversion layer away from the substrate, and is configured to encapsulate the color conversion layer.

15. The display panel according to claim 1, further comprising a cover plate, a first encapsulation layer, a second encapsulation layer and a filling layer, the first encapsulation layer is arranged at a side of the plurality of light-emitting devices away from the substrate, and is configured to encapsulate the plurality of light-emitting devices;

the cover plate is arranged opposite to the substrate;

the color conversion layer is arranged on a side of the cover plate facing the substrate, and the second encapsulation layer is arranged on a side of the color conversion layer away from the cover plate, and is configured to encapsulate the color conversion layer; and the filling layer is arranged between the first encapsulation layer and the second encapsulation layer.

16. A method for manufacturing a display panel, comprising:

forming a plurality of light-emitting devices on a substrate, each of the light-emitting devices comprises a first electrode, a plurality of light-emitting units, and a second electrode sequentially arranged in a direction away from the substrate; wherein the first electrode is a reflection electrode, the second electrode is a transflective electrode, and a microcavity structure is formed between the first electrode and the second electrode; the light-emitting units each comprise a light-emitting layer, light-emission colors of at least two light-emitting layers in a same light-emitting device are different; at least one of the light-emitting devices further comprises a cavity length adjusting layer positioned between the first electrode and a light-emitting unit immediately adjacent to the first electrode;

forming a color conversion layer, the color conversion layer comprises a plurality of wavelength conversion units, each of the wavelength conversion units corresponds to one light-emitting device having the cavity length adjusting layer, and the wavelength conversion unit is arranged on a light exit side of the light-emitting device, and is configured to convert light which is irradiated to the wavelength conversion unit and in a light absorption band of the wavelength conversion unit into light of a target color and emit the light of the target color; and wherein at least one light-emission peak in a light-emission band of the light-emitting device is less than or equal to an intrinsic light-emission peak of a corresponding wavelength conversion unit, and a light absorption band of the wavelength conversion unit is overlapped with the light-emission band of the light-emitting device.

17. A display apparatus, comprising the display panel according to claim 1.

18. The display panel according to claim 2, wherein a material of the wavelength conversion units comprises a quantum dot material.

19. The display panel according to claim 3, wherein a material of the wavelength conversion units comprises a quantum dot material.

20. The display panel according to claim 4, wherein a material of the wavelength conversion units comprises a quantum dot material.

* * * * *